(12) United States Patent
Buchanan et al.

(10) Patent No.: US 8,421,800 B2
(45) Date of Patent: Apr. 16, 2013

(54) SYSTEM AND METHOD FOR SELECTABLE DISPLAY IN OBJECT MODELS

(75) Inventors: Thomas J. Buchanan, Gernika-Lumo (ES); Richard W. Rees, Aliso Viejo, CA (US); Michael Robson, Impington (GB)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 725 days.

(21) Appl. No.: 12/625,019

(22) Filed: Nov. 24, 2009

(65) Prior Publication Data

US 2010/0302242 A1 Dec. 2, 2010

Related U.S. Application Data

(60) Provisional application No. 61/217,283, filed on May 29, 2009.

(51) Int. Cl.
 *G06T 15/00* (2011.01)
(52) U.S. Cl.
 USPC ............ 345/420; 345/419; 345/619; 345/629
(58) Field of Classification Search .................. 345/419, 345/420, 619, 629
 See application file for complete search history.

(56) References Cited

U.S. PATENT DOCUMENTS

| | | | |
|---|---|---|---|
| 7,289,117 B2 * | 10/2007 | Blot et al. ..................... | 345/421 |
| 7,694,238 B2 | 4/2010 | Gibson et al. | |
| 7,913,190 B2 * | 3/2011 | Grimaud et al. .............. | 715/848 |
| 2004/0049341 A1 | 3/2004 | Fujiwara | |
| 2005/0268247 A1 | 12/2005 | Baneth | |
| 2010/0114635 A1 | 5/2010 | Watanabe et al. | |

FOREIGN PATENT DOCUMENTS

EP 1087342 A2 3/2001

OTHER PUBLICATIONS

Nooruddin et al, Interior/Exterior Classification of Polygonal Models, Georgia Institute of Technology, pp. 415-423, Oct. 2000.*
Liang, et al. Published in Computers and Graphics, vol. 18, No. 4, 1994 (pp. 499-506). Elsevier Science Ltd.; Magazine.

* cited by examiner

*Primary Examiner* — Phu K Nguyen

(57) ABSTRACT

A method for displaying objects in a CAD system, and corresponding CAD system and computer program product. The method includes loading a graphic model with a plurality of model elements including edges and faces in a CAD system and receiving a selection of a display technique to be used on the graphic model. The method also includes classifying each model element as important or unimportant. The method also includes hiding a first subset of the unimportant model elements according to the selected display technique and adjusting the transparency of a second subset of the unimportant model elements according to the selected display technique, so that the important model elements are clearly visible with relation to the unimportant model elements. The method can produce a simplified graphic model that is displayed by the CAD system.

21 Claims, 7 Drawing Sheets

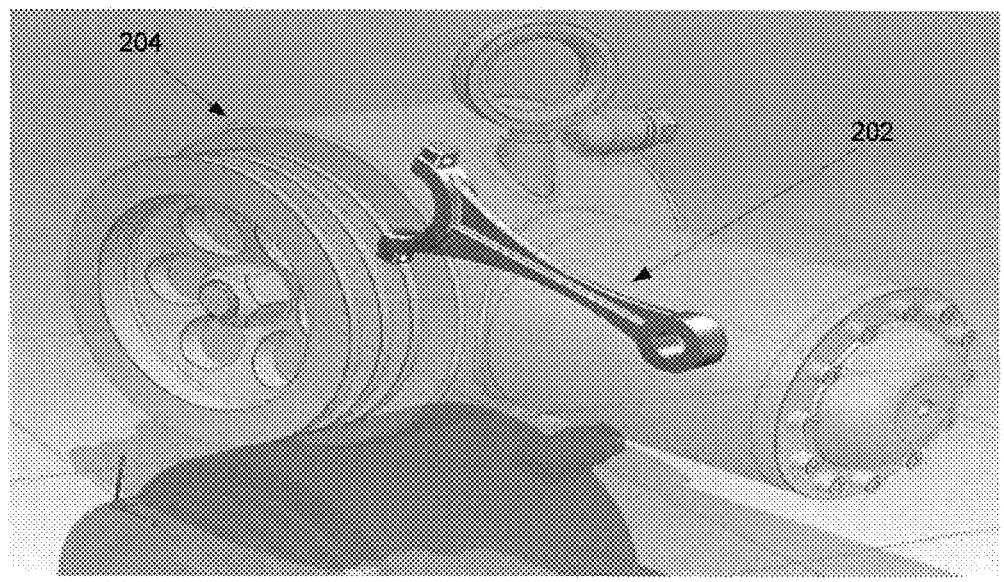
Fig. 2A
Fig. 2B
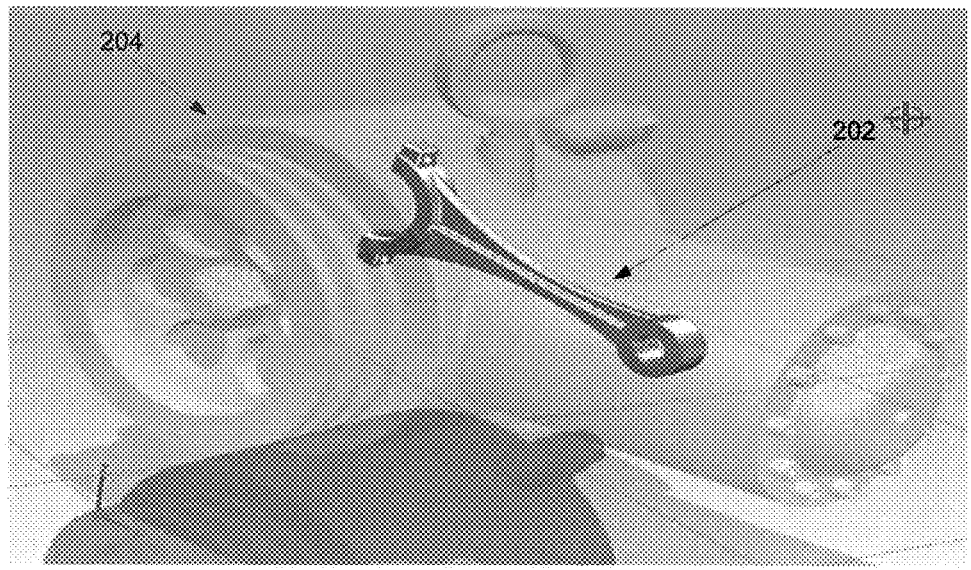

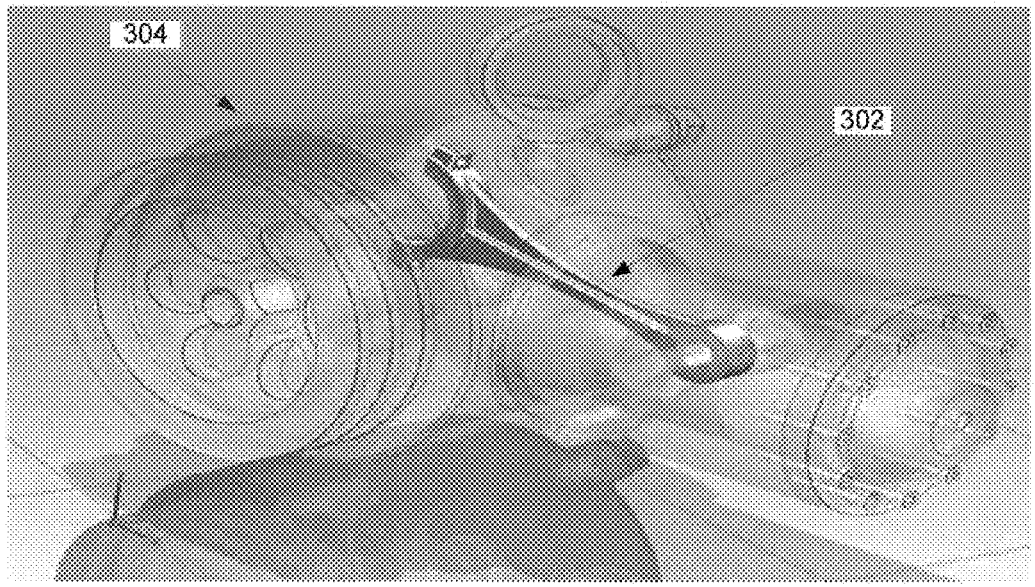
Fig. 3A
Fig. 3B
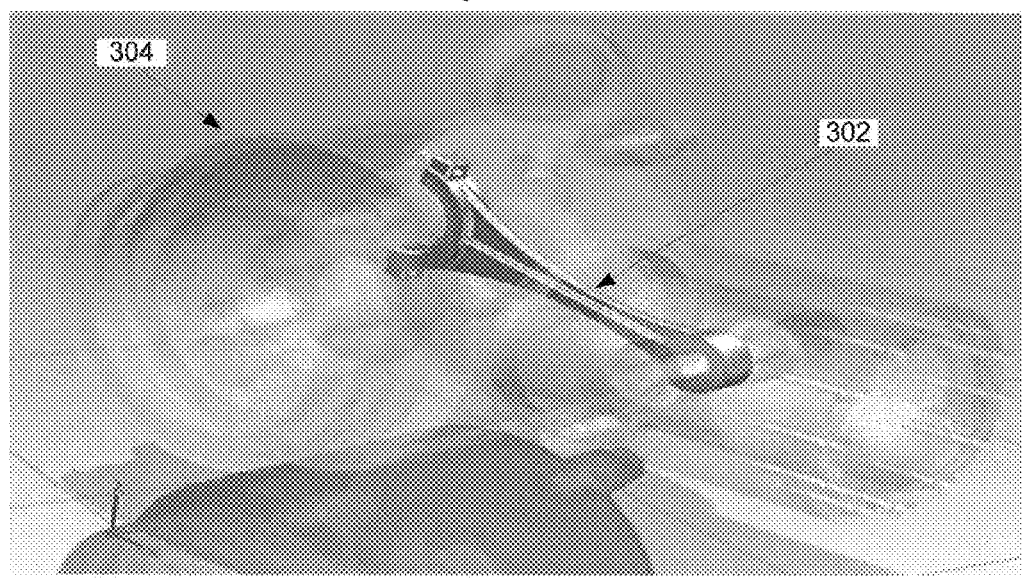

SYSTEM AND METHOD FOR SELECTABLE DISPLAY IN OBJECT MODELS

CROSS-REFERENCE TO OTHER APPLICATION

This application claims priority to U.S. Provisional Patent Application 61/217,283, filed May 29, 2009, which is hereby incorporated by reference.

TECHNICAL FIELD

The present disclosure is directed, in general, to systems and methods for computer-aided design, manufacturing, engineering, modeling, and visualization (individually and collectively, "CAD" and "CAD systems").

BACKGROUND OF THE DISCLOSURE

Many manufactured products are first designed and modeled in computer-aided design and modeling systems. Improved systems are desirable.

SUMMARY OF THE DISCLOSURE

Disclosed embodiments include a method for displaying objects in a CAD system, and corresponding CAD system and computer program product. The method includes loading a graphic model with a plurality of model elements including edges and faces in a CAD system and receiving a selection of a display technique to be used on the graphic model. The method also includes classifying each model element as important or unimportant. The method also includes hiding a first subset of the unimportant model elements according to the selected display technique and adjusting the transparency of a second subset of the unimportant model elements according to the selected display technique, so that the important model elements are clearly visible with relation to the unimportant model elements. The method can produce a simplified graphic model that is displayed by the CAD system.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 2A and 2B illustrate Gray Shell translucency; and

FIGS. 3A and 3B illustrate Gray Layers translucency;

DETAILED DESCRIPTION

Figure 1:
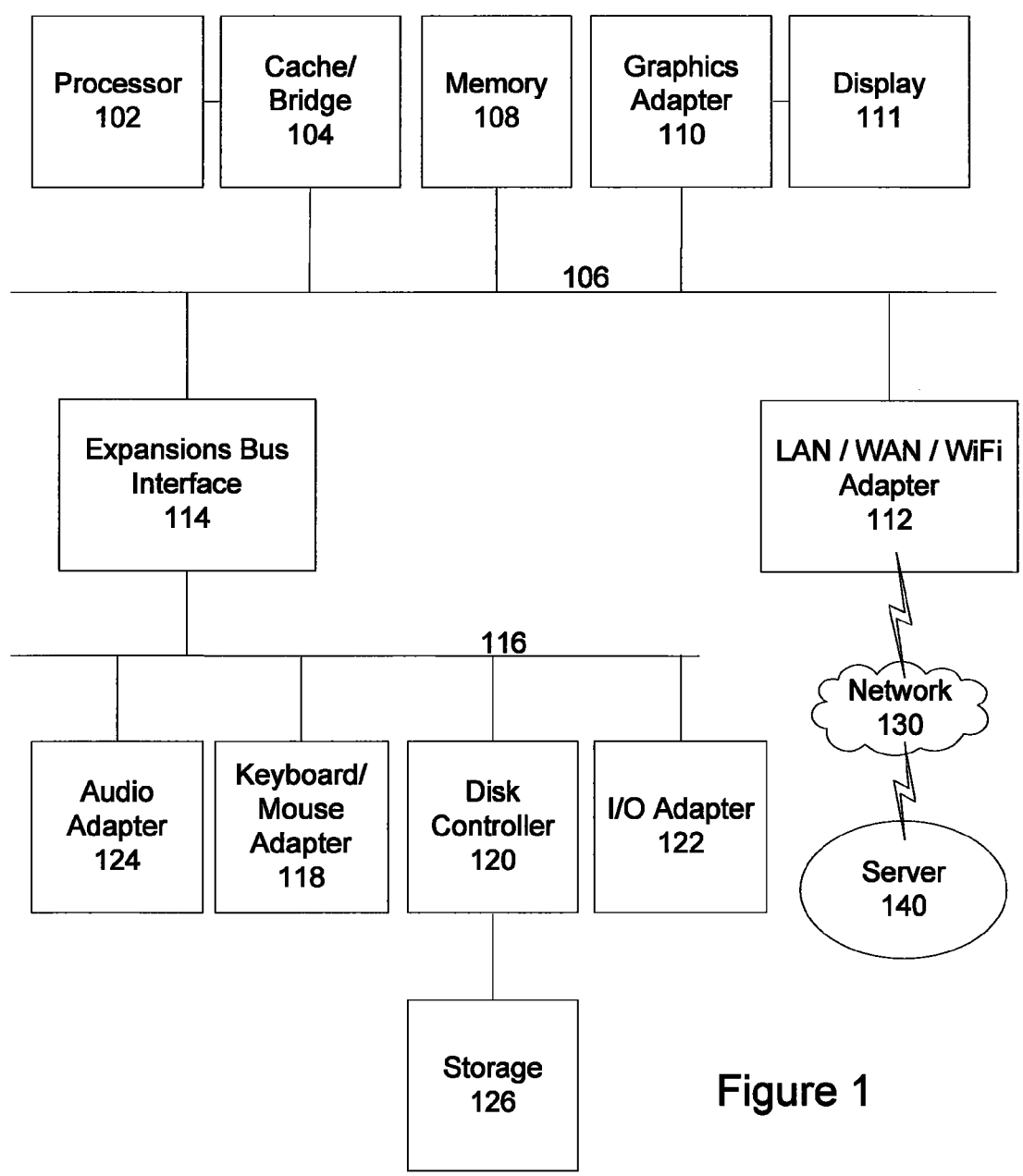
FIG. 1 depicts a block diagram of a data processing system in which an embodiment can be implemented.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Disclosed embodiments include a technique that combines translucency with a reduction of the number of layers and/or edges associated with the "see thru" geometry. By presenting the user's unimportant model geometry as "ghost images" and by reducing what could be thousands of geometry "edges" to a simple shell, the user can focus much more readily on his important geometry, and yet still see the important geometry in context with the unimportant geometry.

Disclosed embodiments include CAD systems and methods. In many situations in CAD and Visualization, geometry that is relatively unimportant to the immediate workflow will impede the user's work on geometry that is important to complete his task by cluttering or obscuring the more important aspects of the view. Note that, as used herein, references to CAD are understood to refer as well to Computer Graphics Visualization Systems, and the techniques disclosed herein can apply as well to any computer software system capable of rendering computer graphics. These could include CAD, MCAD, ECAD, Architectural, etc., as understood to those of skill in the art.

While it can be helpful for a user to work "in context", where all of the model's geometry is visible, too much detail can prevent a user from working effectively. One technique for addressing this issue is to make some or all of the unimportant geometry translucent, using known techniques, so that the user can see into the model. Often this approach isn't sufficient, since model edges complicate the scene making it hard to see into a model. Translucency helps but always keeps the same number of distracting layers of geometry, and does nothing to reduce edge clutter.

The disclosed embodiments include a technique that combined translucency with a reduction of the number of layers and/or edges associated with the "see thru" geometry. By presenting the user's unimportant model geometry as "ghost images" and by reducing what could be thousands of geometry "edges" to a simple shell, the user can focus much more readily on his important geometry, and yet still see the important geometry in context with the unimportant geometry. This allows CAD users to easily focus on important visual feedback relative to their model geometry by effectively de-emphasizing geometry that has been clearly identified as not important. There are numerous conditions in CAD where there is a mix of "known" important and unimportant geometry, and the disclosed embodiments include techniques for distinguishing between important and unimportant geometry in a model.

FIG. 1 depicts a block diagram of a data processing system in which an embodiment can be implemented, for example as a particular machine implementing a computer-aided design and modeling system as described. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EE-PROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary in particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments include an improved user-controlled display option referred to herein as a "See-Thru" function or option. When the user enables the See-Thru option, all important facet geometry has its usual appearance, but all unimportant facet geometry is displayed with See-Thru translucency.

Three styles of See-Thru translucency are supported. FIGS. 2A and 2B illustrate Gray Shell translucency, a first translucency style in accordance with disclosed embodiments. Of course, while gray is discussed here as an exemplary neutral color, those of skill in the art will recognize that any color could be used. With this style, the topmost visible layer of unimportant facet geometry is displayed with See-Thru translucency in a light gray color. Hidden unimportant facet geometry is not displayed. FIG. 2A depicts a model with Grey Shell Edges ON, while FIG. 2B depicts a model with Grey Shell Edges OFF. Note in each case that important geometry 202 is shown as solid and opaque, in detail, while unimportant geometry 204 is displayed in translucent gray.

Other embodiments can use a Color Shell translucency, a second translucency style, not illustrated here based on the limitations of patent publications. With this style, the topmost visible layer of unimportant facet geometry is displayed with See-Thru translucency in the usual color of the geometry. Hidden unimportant facet geometry is not displayed. Color Shell Edges can also be set to ON or OFF as described above. In each case, the important geometry is shown as solid and opaque, in detail, while unimportant geometry is displayed as translucent, but in color. Any of the important or unimportant geometry can be displayed in any color selected by a user or set by default.

FIGS. 3A and 3B illustrate Gray Layers translucency, a third translucency style. With this style, all layers of unimportant facet geometry (visible and hidden) are displayed with See-Thru translucency in a light gray color. Hidden unimportant edge geometry is not displayed in this example. FIG. 3A depicts a model with Grey Layers Edges ON, while FIG. 3B depicts a model with Grey Layers Edges OFF. Note in each case that important geometry 302 is shown as solid and opaque, in detail, while unimportant geometry 304 is displayed in translucent gray.

In each of the figures discussed above, note that the "Edges On" views show all edges for important geometry and outer shell edges for unimportant geometry, while "Edges Off" removes unimportant and hidden edges.

With regards to the grey shell, various embodiments include an option to allow users to select which color to use for the shell color and an option will provide to allow users to select the level of translucency for the display. When See-Thru is enabled, if shaded edges are displayed (i.e., Shaded Edge Color is not disabled), then shaded edges are displayed only for the topmost visible layer of unimportant facet geometry, regardless of the See-Thru style.

In various embodiments, See-Thru can be used for Shaded, Partially Shaded, Face Analysis, and True Shading modeling views. As noted, See-Thru translucency is preferably applied to unimportant facet geometry only. The determination of important versus unimportant can be based on display attribute settings, as discussed below.

In various embodiments, if any display attributes such as Prehighlighting, Highlighting, Show-through, and Overlay are enabled for facet geometry, important facet geometry is determined using the following considerations. Unless Random Color is enabled, if Override Color is enabled for facet geometry, this facet geometry is important. If De-Emphasis is enabled for facet geometry, this facet geometry is unimportant. All remaining facet geometry is important if De-Emphasis is enabled for some or any currently displayed geometry and unimportant if De-Emphasis is not enabled for any currently displayed geometry.

As used herein, Pre-highlighting/Highlighting is visual feedback to the user concerning geometry which is about to be selected, or already selected, presumably for that geometry to be modified. In a sense, the user has expressed importance. Applications can express importance programmatically by applying show-thru to geometry (which literally makes that geometry appear to show through by rendering it last/on top of other geometry). Again, in a sense, the application has expressed importance of key geometry. Overlay is a similar display capability that an application can utilize (programmatically) to express importance.

In various embodiments, these rules produce the following general behaviors. If De-Emphasis is used, non-de-emphasized facet geometry is important and has its usual appearance, but de-emphasized facet geometry is unimportant and is displayed with See-Thru translucency. If De-Emphasis is not used, Prehighlighted and Highlighted facet geometry is important and has its usual appearance, but most other facet geometry is unimportant and is displayed with See-Thru translucency.

See-Thru involves two user settings, in some embodiments, including an on/off setting and a separate style setting, which can be set to one of the three styles described above. When the user enables See-Thru (i.e., he turns on the on/off setting), See-Thru is enabled in the current style.

The user settings are session settings, so they are not saved in a part file. They are initialized as follows at the start of each session. The on/off setting is initialized to off, and the style setting is initialized to the setting saved in the user's registry, if available. If no setting is found in the registry, the style setting is initialized to the default value, which is "Gray Shell".

The current style setting is saved in the user's registry when the session terminates. Although See-Thru is a user-controlled option, other system functions and applications can programmatically toggle the option.

Various embodiments as discussed herein combine translucency techniques with and edge display modification by removing all unimportant edges, except for those which exist on the outer shell of the model. This allows the system to preserve the shape of the model, but reduce the clutter of edges.

In typical systems, translucency or translucency often is not good enough because the model is complex enough that the part of interested is almost completely occluded by the edges and the layers of model geometry.

Figure 4:
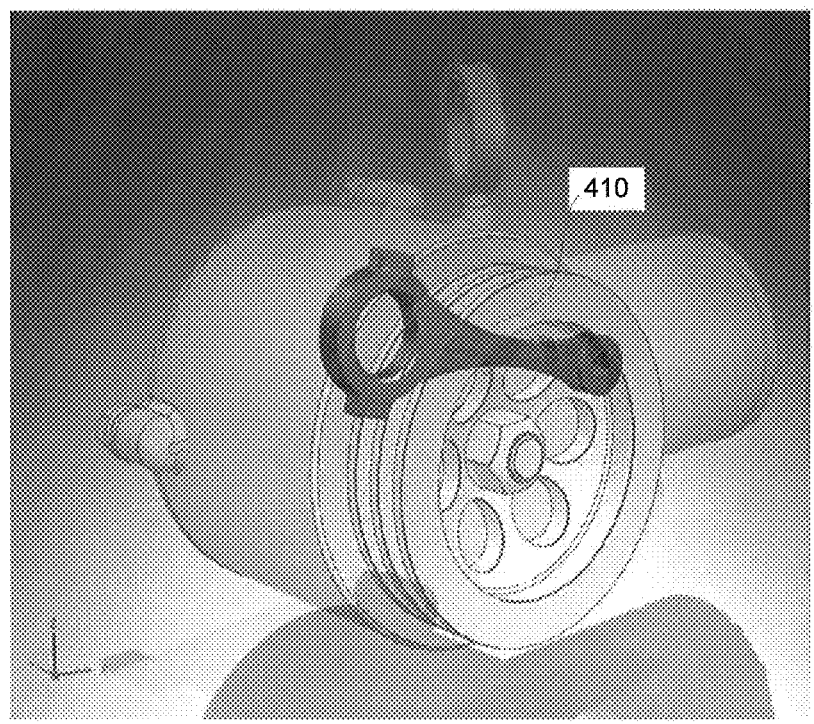
FIG. 4 illustrates a case where a see-thru technique reduces the layers and the edges of unimportant geometry, making it easier to see the enclosed important geometry.

FIG. 4 illustrates a case using techniques in accordance with disclosed embodiments, where See-Thru reduces the layers and the edges, leaving just the shell. This figure illustrates a case where a see-thru technique reduces the layers and the edges of unimportant geometry, making it easier to see the enclosed important geometry. Note that the connector rod 410 is easily visible. This can be very desirable to many users because the color coding of the components which are "important" are critical to the user doing his job. The user needs to see the color coding for all components that meet the criteria of his analysis (and all other objects need to be see-thru)

Figure 7:
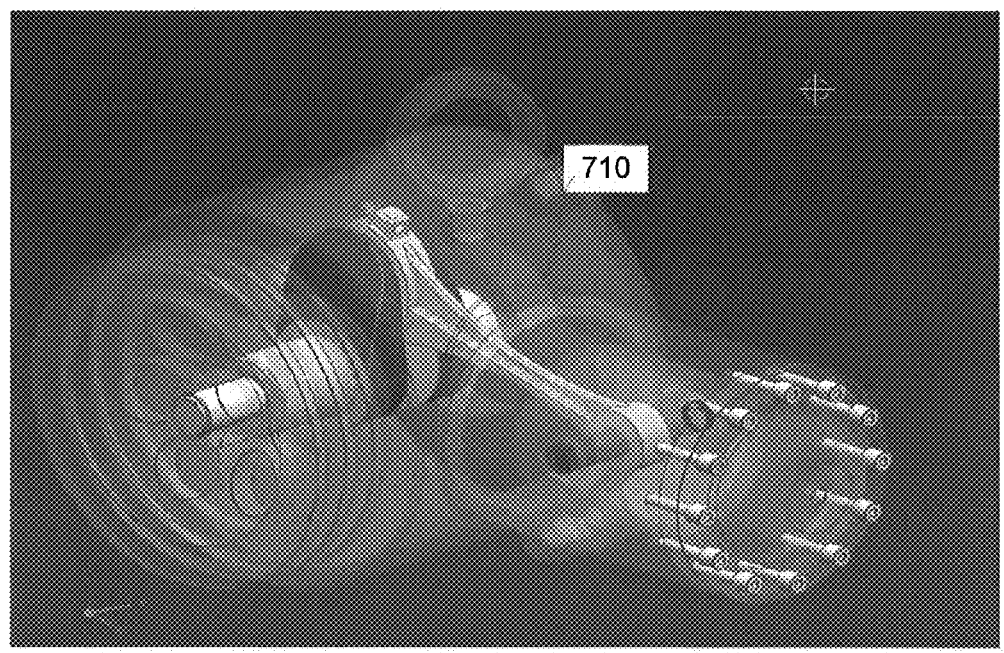
FIG. 7 depicts a model using See-Thru which actually preserves the layers of translucency, but reduces the edge clutter.

In some workflows, users are still very interested in the associations of geometry and only want to reduce the edge clutter. FIG. 7 shows the gray layers See-Thru technique in accordance with disclosed embodiments. Notice the edges are still helpful on the outer shell, and other geometry is there (in ghost form) so the user can see some of the 3D characteristics of the model, but the connector rod and the crankshaft are clearly visible.

In accordance with disclosed embodiments, the See-Thru technique that enhances visualization and comprehension of the most important geometry in a 3D CAD model, and can be implemented, for example, as a particular machine data processing system, considered as a method performed on or using a particular machine data processing system, or as suitable machine-readable instructions encoded in a tangible machine-readable medium. The system achieves an improved CAD view by selectively removing and de-emphasizing less important model geometry while still providing 3D spatial context for the geometry of interest.

Figure 5:
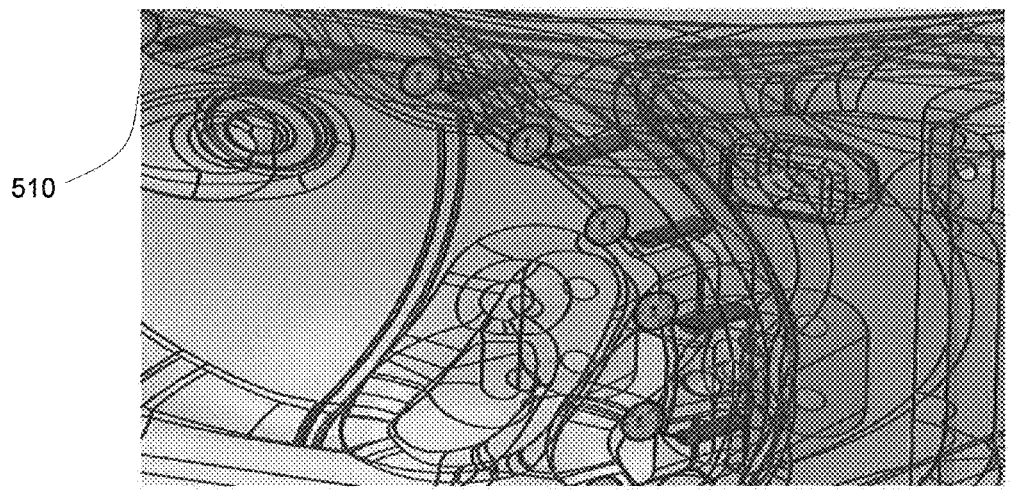
FIG. 5 illustrates one technique for ensuring that important geometry in the scene was clearly differentiated from the surrounding geometry.

FIG. 5 illustrates one technique for ensuring that important geometry in the scene was clearly differentiated from the surrounding geometry, which was being kept in place to help a user understand the important geometry's context. Assume in this example that the user is examining hole diameters, with the holes colored according to their size, such as hole 510. Clearly anything that is not a hole in this example is relatively unimportant (but not extraneous) because the user will want to know where that hole is relative to the other geometry. This technique used translucency alone to allow the user to see "into" the model, and keep all model geometry in the scene, so the user could work "in context".

The more complicated the model, the more that the edge display obscures the model. In some cases, the unimportant facet geometry is actually translucent but the face edges are not, since translucency is generally used for facet geometry, not wireframe geometry. In this case, the clutter from the face edges makes it very hard for the user to even see the rules-based colored geometry, which is critical to his ability to complete his assignment.

Even in situations where all edge display is turned off, multiple layers of translucent geometry can often make it difficult to see clearly what geometry is supposed to be highlighted as important. Particularly in cases where important geometry is buried in the middle of a model, a system can set all components of the model (besides the important one) are translucent. In these cases, the layers of translucency combined with the edges can still make it impossible to work on the object of interest.

Figure 6:
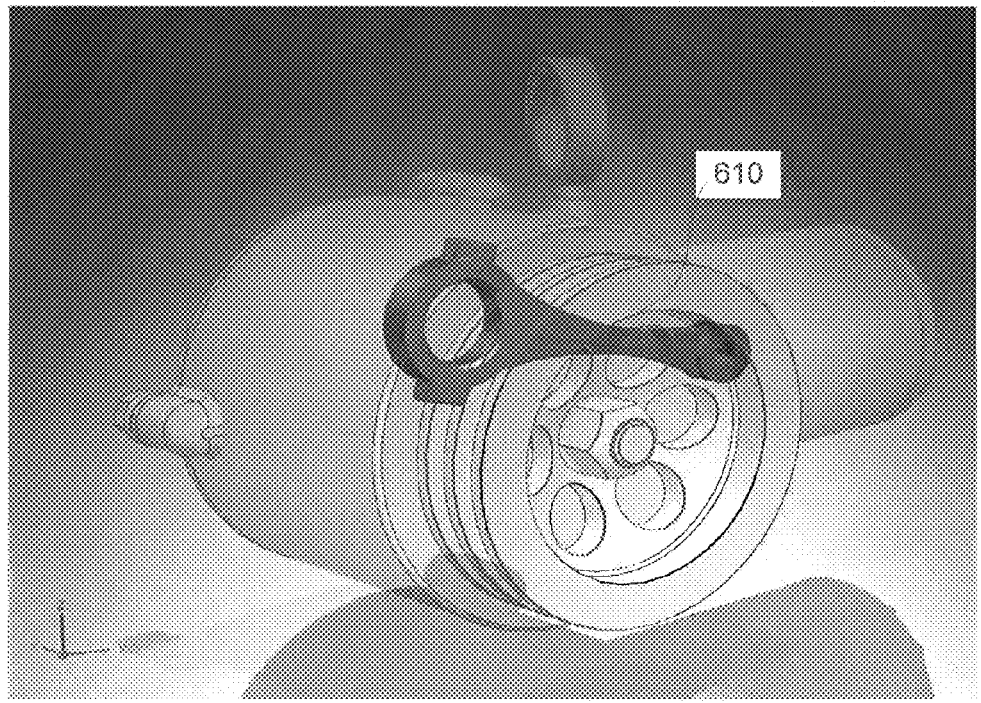
FIG. 6 illustrates a model with translucency and reduced edges/layers.

One See-Thru technique as disclosed herein produces a graphics effect where all the layers of geometry are stripped away besides the outer shell. The system reduces the clutter of translucent layers and all the clutter of edge geometry (except for the outer shell) and makes it much easier to identify and work on the important geometry. This gives the user the feeling that he is still working in the context of the entire model, but drastically reduces the complexity of the model. FIG. 6 illustrates a model with transparency and reduced edges as described herein, where connector rod 610 is clearly visible beneath the simplified outer shell.

See-Thru is actually not one option. As described above, various embodiments allow various alternatives (basic shell, colored shell, layers) and some edge display options (default, user defined edge color, no edges). The user can choose among various options according to his preference. For example, FIG. 7 depicts a model which actually preserves the layers of translucency, which can give the user a stronger connection to the see-thru geometry than the shell option shown above, as the user is given many more 3D hints as to where his important geometry, such as connector rod 710, interacts with the unimportant geometry. Stripping out all the edges inside the model's outer shell of the visuals can be a vast improvement over translucency-only approaches, in some cases.

The disclosed techniques solve a common CAD problem, and are useful in many different CAD customer situations, because there are so many cases where CAD systems already know and identify important geometry and unimportant, or de-emphasized geometry. A few examples of where the disclosed See-Thru techniques can be used are discussed below:

De-Emphasis: In a CAD product according to some embodiments, geometry can be de-emphasized geometry, but other techniques only treat the de-emphasized geometry with color. Using disclosed embodiments, users can enhance de-emphasis with using the disclosed See-Thru techniques. In these Work Part Emphasis embodiments, using the disclosed see-thru techniques, any non-work or unimportant part geometry can be shown using the disclosed see-thru techniques instead of color treatment/opaque techniques.

Figure 8:
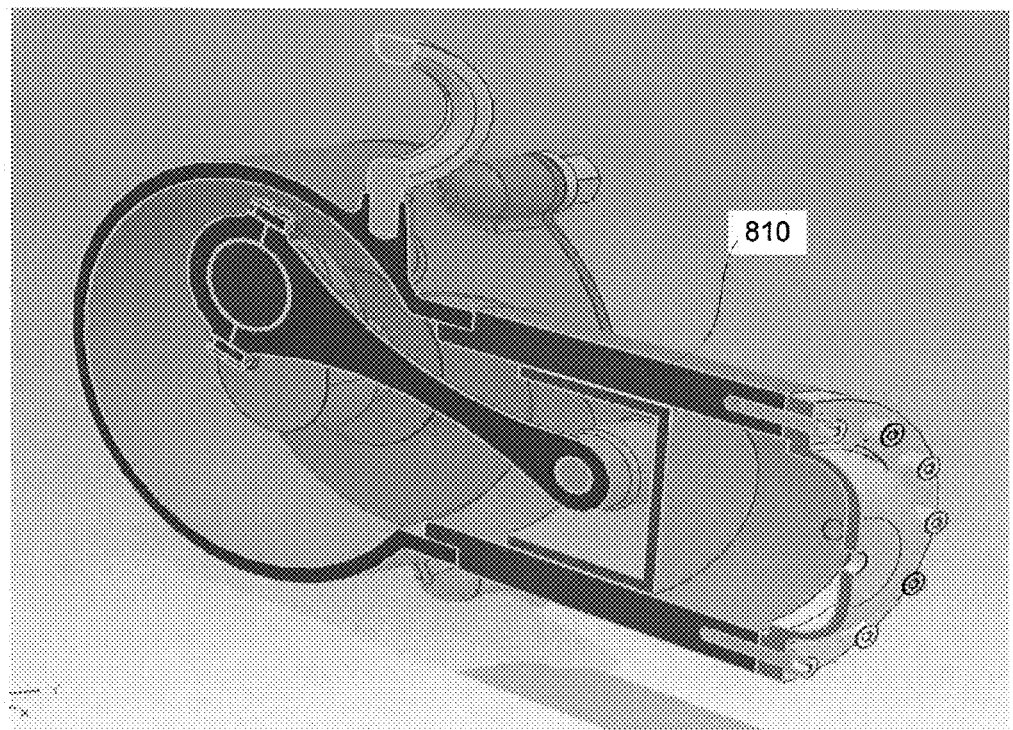
FIG. 8 illustrates dynamic sectioning where the capped surface is identified as important geometry, and everything else is See-Thru.

Sectioning: Disclosed embodiments also include techniques for dynamic sectioning, where a user can intersect a model with a plane and then "cap" the resultant sectioned geometry with a corresponding face for each object that is parallel to the intersecting plane. Various embodiments allow the user to apply a cap to a sectioned body, which can be move dynamically. Often the cap is the most important part of what he is interested in viewing. However, all the non-cap geometry tends to clutter the view. In conventional systems, it is often difficult to focus on the section/capped geometry from the non-capped geometry:

In many situations, analyzing the capped surface is important to users. However, it is often difficult to see the capped surface clearly. FIG. 8 depicts a capped surface, for example at surface 810, that is identified as important geometry, and the disclosed see-thru techniques in combination with sectioning allow the user to see the capped surface clearly by de-emphasizing the remaining geometry. In some cases, the resulting edges between the cap faces and adjoining faces of the intersected objects can be emphasized, for example by using a different color.

Rules Based Presentations: One use of the disclosed See-Thru techniques is to allow color-coded geometry or other specific geometry selected based on some important rules/criteria to be clearly visible, and not obscured by geometry which was not significant to the applied rules. One way in which this can be implemented is for the system or user to indicate that objects or features having a particular color coding or other characteristic are important, while other geometry is unimportant.

Conditional Display, in some embodiments, includes overriding color for geometry of interest, following a legend, translucency and de-emphasis for geometry not of interest, and no special treatment of edges (beyond color washing).

Various techniques disclosed herein distinguish between important and unimportant geometry. There are a number of ways in which the system can determine important from unimportant.

One technique is to allow a user to specify what is important to him, by mouse clicks or other typical input means. In some cases, common CAD applications can characterize data directly as important or unimportant. In other cases, the system uses "meta-data" which has associated geometry. For example, the meta-data could be a rules-based request from a user which is handled by the application (hole sizes in the geometry). In this example, holes that are smaller than 10 mm could be identified as a collection of features to be color coded as green, holes that are greater than 10 mm could be color coded blue, and holes that are 10 mm are red. Any geometry which is not a hole in this scenario is not important and will be shown as see-thru.

Note that the hole example isn't necessarily the most important rule to a customer evaluating a part where programmatic control for important/unimportant geometry can be assessed by a client's meta-data. Any rule that can be applied for such distinctions, such as: identifying components that are or are not owned by a particular organization, running over cost, running under cost, which components of the engine assembly of a car are on-time, late, or otherwise. For any of these rules, the identified components can be shown in the context of the entire assembly, with the rest of the assembly processed as unimportant using the see-through techniques described herein.

Various embodiments include de-emphasis of various geometry. CAD systems include the concept of a current Work Part (which is a subset of an assembly), and the concept of a Work Plane (which is the base plane a designer works on). In both of these examples, a user can emphasize the work part relative to the rest of the assembly, or objects that are on the work plane relative to geometry that is not directly on the work plane. Disclosed embodiments include a color wash technique to de-emphasize the "non-important" geometry and further enable the user to just toggle on see-thru, and he will get the see-thru effect for de-emphasis, which is much more effective.

Some Work Part Emphasis only uses color wash to de-emphasize, which are improved in the presently disclosed systems by using See-Thru techniques. Consider the above cases described above where the work part is buried in the model and can't be seen well or at all. Color is completely ineffective, but the disclosed See-Thru techniques make it easy to identify the work part.

For Work Plane Emphasis, again note that currently the work plane emphasis can only be seen under the work plane, as opposed to how a user will be working (above the work plane). Currently, above the work plane, one cannot see the model's de-emphasis relative to the work plane emphasis. Using the disclosed See-Thru techniques, the user can see the work plane and the model geometry. In some embodiments, the user can specify the amount of see-thru, and may specify more or less translucency.

Figure 9:
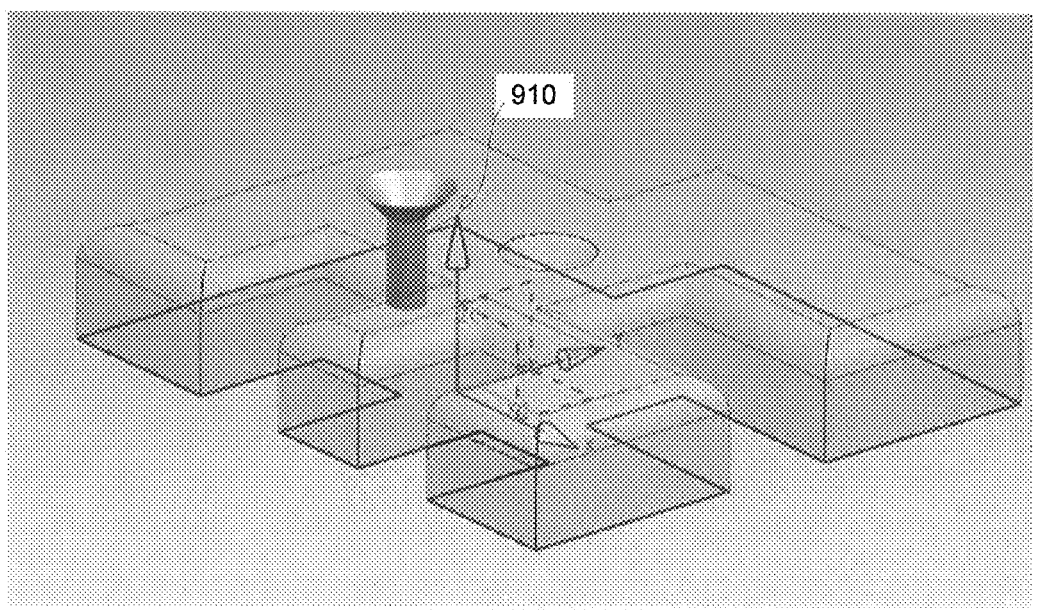
FIG. 9 illustrates improved feature creation with See-Thru.

Other features of various embodiments include specific user control of important/unimportant features. The system can programmatically choose to emphasize important geometry, over non-important. When a user is creating new features in the product, See-Thru will be more effective than not treating the other geometry, or treating with just translucency. FIG. 9 illustrates feature creation; in this case the user is creating a new countersunk hole 910 in the model. It is very easy to see the new feature relative to how it will be created within the model.

Various embodiments include a display technique wherein the system shows a translucent outer shell of the geometry that is not of interest, while letting the transparent shell hide the geometry that is not of interest. The system displays the important geometry through the transparent shell to allow the user to clearly see and work with the components he is interested in. This allows the components to be readily found, easily selected, and viewed in the context of the product in which they are being used.

Figure 10:
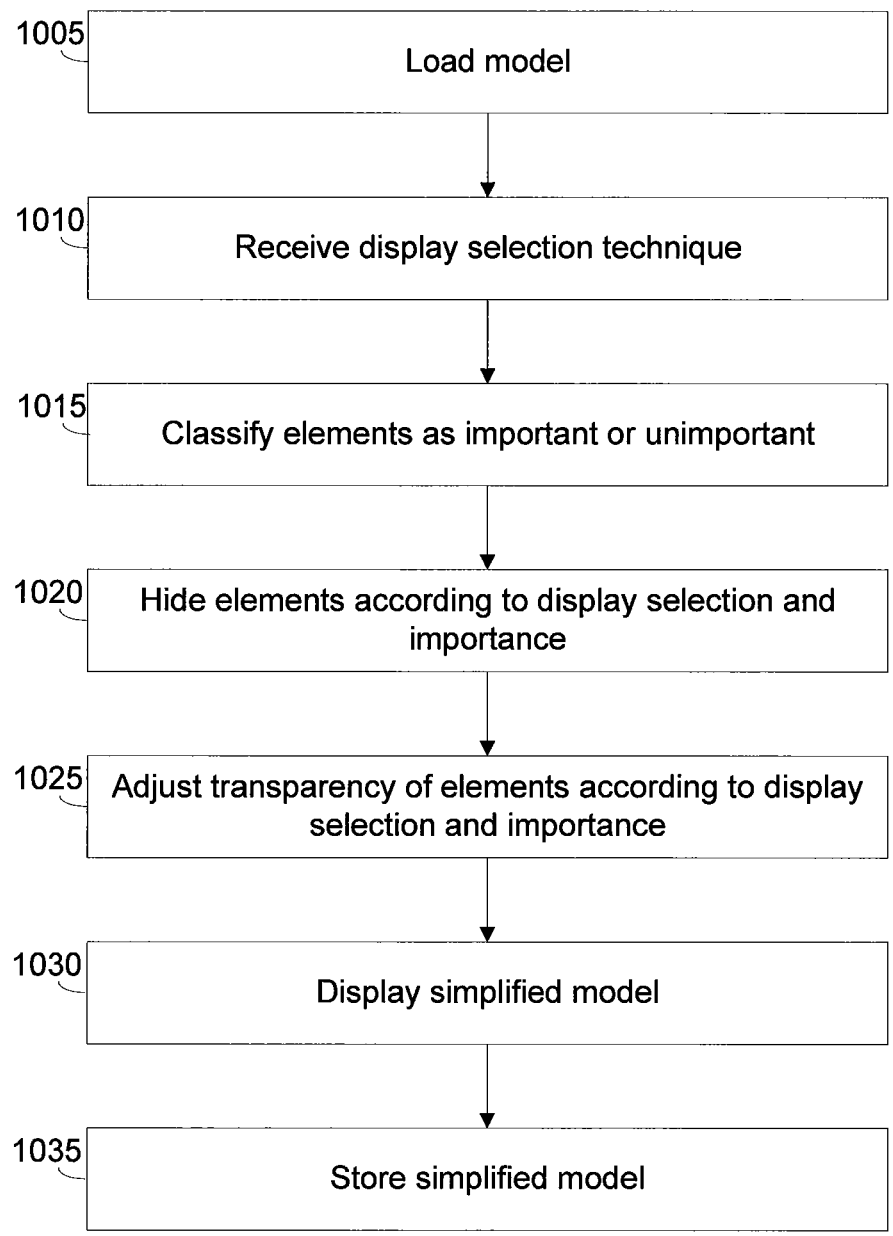
FIG. 10 depicts a flowchart of a process in accordance with disclosed embodiments.

FIG. 10 depicts a flowchart of a process in accordance with disclosed embodiments.

The CAD system loads a CAD graphic model including multiple CAD model elements (step 1005).

The CAD system receives a selection of display techniques, as described above (step 1010). This selection can be received from a user as a user input, or can be received from another application or system.

The CAD system then classifies at least some of the model elements, including edges and faces, as important or unimportant (step 1015). This step can have been already performed (for de-emphasis reasons, for example), and can include receiving a specific user selection, classifying the elements according to a rule, classifying them according to display attribute settings, or classifying them according to a selection received from another system or application, as well as other techniques described herein or understood by those of skill in the art. Of course, the actual labels of "important" or "unimportant" need not be used, so long as elements are classified so as to distinguish which elements should be displayed normally, emphasized, de-emphasized, simplified, or otherwise processed as described herein.

The CAD system then hides or modifies specific geometry or elements according to the display selection and importance, as described above (step 1020). This step can include hiding a first subset of the unimportant model elements according to the selected display technique. Hiding, in some cases, will be understood to mean removing them from the displayed view of the object graphic model.

The CAD system adjusts the transparency of specific geometry, preferably according to the importance classification and display technique selection, to achieve the See-Thru effects described herein (step 1025). The steps of hiding elements and adjusting the transparency of elements together produce a simplified graphic model. This can include adjusting the transparency of a second subset of the unimportant model elements so that the important model elements are clearly visible with relation to the unimportant model elements. Transparency, in some cases, will be understood to include the concept of translucency, where the particular element is visible but underlying elements can be seen.

The CAD system displays the simplified CAD graphic model (step 1030), and can also store the simplified CAD graphic model in a machine-readable medium (step 1035), transmit it to another system, and/or receive user edits to the simplified CAD geometry.

The process described above can also include a step of cross-sectioning the object model, optionally including adding one or more cross-section faces. One or more of the faces or edges affected by the cross-sectioning can be designated as important.

Other embodiments include a particular machine data processing system configured to perform a similar method, and a tangible machine-readable medium encoded with machine-readable instructions that when executed cause a particular machine data processing system to perform a method as described.

Various embodiments therefore include a method for displaying objects in a computer-aided design system, including the steps of receiving a user's selection of a display technique to be used on a graphic model with a plurality of model elements including edges and faces, classifying each model element as important or unimportant, hiding a first subset of the unimportant model elements according to the selected display technique, adjusting the transparency of a second subset of the unimportant model elements so that the important model elements are clearly visible with relation to the unimportant model elements, and displaying the graphic model.

Various embodiments also include a mechanism for improving the ability for people to view, select, and interact with information and geometry in a CAD or Visualization system by simplifying the rendering of a complex model through the use of translucency, emphasis of important layers of geometry and components, and de-emphasis of less important geometry.

Various embodiments also include a mechanism for improving the ability for people to interact with geometry in a CAD or Visualization system by simplifying the rendering of complex models that have been cross sectioned through the use of translucency, emphasis of important layers of geometry and components, and de-emphasis of less important geometry.

Various embodiments also include a system, method, and computer program product for CAD display that combines translucency with a reduction of the number of layers and/or edges associated with geometry that is not of immediate importance to a user. By presenting the user's unimportant model geometry as "ghost images" and by reducing what could be thousands of geometry "edges" to a simple shell, the user can focus much more readily on his important geometry, and yet still see the important geometry in context with the unimportant geometry.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

Those of skill in the art will recognize that various programming and coding approaches can be used to implement features as described herein, and the claimed embodiments are not limited by the illustrations and examples used herein.

What is claimed is:

1. A method for displaying objects in a CAD system, comprising:
    loading a graphic model with a plurality of model elements including edges and faces in a CAD system;
    receiving, by the CAD system, a selection of a display technique to be used on the graphic model;
    classifying each model element as important or unimportant by the CAD system,
    based on the classification, automatically hiding, by the CAD system, a first subset of the unimportant model elements according to the selected display technique and adjusting the transparency of a second subset of the unimportant model elements according to the selected display technique, by the CAD system, so that the important model elements are clearly visible with relation to the unimportant model elements, thereby producing a simplified graphic model; and
    displaying the simplified graphic model by the CAD system.

2. The method of claim 1, further comprising cross-sectioning the graphic model and adding at least one cross-section face to the graphic model.

3. The method of claim 1, wherein unimportant edges are hidden.

4. The method of claim 1, wherein unimportant faces on the interior of the graphic model are hidden by the CAD system.

5. The method of claim 1, wherein unimportant edges on the interior of the graphic model are hidden by the CAD system.

6. The method of claim 1, wherein unimportant faces on a shell of the graphic model are displayed with at least partial transparency.

7. The method of claim 1, wherein the second subset of unimportant model elements are displayed with a partial transparency, and faces in the second subset of unimportant model elements are displayed in a uniform color.

8. The method of claim 1, wherein the classifying step is performed in response to a user section of at least one feature of the graphic model.

9. The method of claim 1, wherein the model elements are classified as important or unimportant in accordance with a user selection.

10. The method of claim 1, wherein the model elements are classified as important or unimportant in accordance with display attributes associated with each model element.

11. A CAD system comprising a processor and accessible memory, the CAD system particularly configured to perform the steps of:
    loading a graphic model with a plurality of model elements including edges and faces;
    receiving a selection of a display technique to be used on the graphic model;
    classifying each model element as important or unimportant,
    based on the classification, automatically hiding a first subset of the unimportant model elements according to the selected display technique and adjusting the transparency of a second subset of the unimportant model elements according to the selected display technique so that the important model elements are clearly visible with relation to the unimportant model elements, thereby producing a simplified graphic model; and
    displaying the simplified graphic model.

12. The CAD system of claim 11, wherein the CAD system is further configure to perform the step of cross-sectioning the graphic model and adding at least one cross-section face to the graphic model.

13. The CAD system of claim 11, wherein unimportant edges are hidden.

14. The CAD system of claim 11, wherein unimportant faces on the interior of the graphic model are hidden by the CAD system.

15. The CAD system of claim 11, wherein unimportant edges on the interior of the graphic model are hidden by the CAD system.

16. The CAD system of claim 11, wherein unimportant faces on a shell of the graphic model are displayed with at least partial transparency.

17. The CAD system of claim 11, wherein the second subset of unimportant model elements are displayed with a partial transparency, and faces in the second subset of unimportant model elements are displayed in a uniform color.

18. The CAD system of claim 11, wherein the classifying step is performed in response to a user section of at least one feature of the graphic model.

19. The CAD system of claim 11, wherein the model elements are classified as important or unimportant in accordance with a user selection.

20. The CAD system of claim 11, wherein the model elements are classified as important or unimportant in accordance with display attributes associated with each model element.

21. A non-transitory machine-readable medium encoded with machine-readable instructions, that, when executed, cause a CAD system to perform the steps of:
    loading a graphic model with a plurality of model elements including edges and faces;
    receiving a selection of a display technique to be used on the graphic model;
    classifying each model element as important or unimportant,
    based on the classification, automatically hiding a first subset of the unimportant model elements according to the selected display technique and adjusting the transparency of a second subset of the unimportant model elements according to the selected display technique so that the important model elements are clearly visible with relation to the unimportant model elements, thereby producing a simplified graphic model; and displaying the simplified graphic model.

* * * * *